United States Patent
Egawa et al.

(10) Patent No.: US 11,802,797 B2
(45) Date of Patent: Oct. 31, 2023

(54) INSPECTION METHOD, INSPECTION APPARATUS, PRODUCTION METHOD, AND PRODUCTION SYSTEM FOR HEATSINK

(71) Applicant: TOYOTA JIDOSHA KABUSHIKI KAISHA, Toyota (JP)

(72) Inventors: Yuta Egawa, Toyota (JP); Katsuhiro Takami, Ichinomiya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 585 days.

(21) Appl. No.: 17/023,238

(22) Filed: Sep. 16, 2020

(65) Prior Publication Data

US 2020/0408600 A1 Dec. 31, 2020

Related U.S. Application Data

(62) Division of application No. 16/211,285, filed on Dec. 6, 2018, now abandoned.

(30) Foreign Application Priority Data

Jan. 11, 2018 (JP) .................................. 2018-002907

(51) Int. Cl.
*G01K 3/00* (2006.01)
*G01J 5/00* (2022.01)
(Continued)

(52) U.S. Cl.
CPC ............ *G01J 5/0003* (2013.01); *F28F 13/18* (2013.01); *F28F 21/067* (2013.01); *G01N 25/72* (2013.01);
(Continued)

(58) Field of Classification Search
CPC .. G01J 5/0003; G01J 2005/0077; F28F 13/18; F28F 21/067; G01N 25/72; G01K 3/00
See application file for complete search history.

(56) References Cited

U.S. PATENT DOCUMENTS 5,344,236 A * 9/1994 Fishman ................ G01N 25/72
374/7
6,054,198 A * 4/2000 Bunyan .................... C09K 5/06
524/404
(Continued)

FOREIGN PATENT DOCUMENTS

CN 101055169 A * 10/2007
CN 107153079 A * 9/2017
(Continued)

OTHER PUBLICATIONS

17023238_May 1, 2023_CN_106501305_B_H.pdf.*
(Continued)

*Primary Examiner* — Gail Kaplan Verbitsky
(74) *Attorney, Agent, or Firm* — Oblon, McClelland, Maier & Neustadt, L.L.P.

(57) ABSTRACT

A method for inspecting a heatsink in which a heat dissipation layer is formed on a surface of a substrate formed by casting, includes shooting the heat dissipation layer by image pickup means in a state where residual heat transferred from the substrate to the heat dissipation layer remains and thereby acquiring image data representing a temperature distribution on a surface of the heat dissipation layer, the heat dissipation layer being formed by performing a film-forming process on the surface of the substrate where residual heat that is generated when the substrate is cast remains, the image pickup means being configured to receive an emission of light from molecules of the heat dissipation layer.

4 Claims, 10 Drawing Sheets

(51) Int. Cl.
    *F28F 13/18*     (2006.01)
    *F28F 21/06*     (2006.01)
    *G01N 25/72*     (2006.01)

(52) U.S. Cl.
    CPC ........ *G01J 2005/0077* (2013.01); *G01K 3/00* (2013.01)

(56) References Cited

U.S. PATENT DOCUMENTS

| | | | |
|---|---|---|---|
| 6,488,405 | B1 | 12/2002 | Eppes et al. |
| 8,692,887 | B2* | 4/2014 | Ringermacher ... G01B 11/0658 348/86 |
| 2003/0128737 | A1* | 7/2003 | McGrath ............ G01K 11/3213 374/161 |
| 2006/0114965 | A1* | 6/2006 | Murphy ................. G01N 25/72 374/E11.003 |
| 2009/0312956 | A1* | 12/2009 | Zombo ................... F01D 5/288 374/57 |
| 2010/0183045 | A1* | 7/2010 | Nakahara .............. G01J 5/0007 374/130 |
| 2011/0228498 | A1 | 9/2011 | Kawai et al. |
| 2014/0060790 | A1* | 3/2014 | Shyu ................... H01L 23/3736 205/333 |
| 2014/0062496 | A1 | 3/2014 | Kwon et al. |
| 2016/0150680 | A1* | 5/2016 | Aramaki ............ H01L 23/3737 165/185 |
| 2018/0087967 | A1* | 3/2018 | Glynn ................... G01J 5/0003 |
| 2018/0088063 | A1* | 3/2018 | Glynn ................... G01N 25/72 |

FOREIGN PATENT DOCUMENTS

| | | | | |
|---|---|---|---|---|
| CN | 107286837 | A | * | 10/2017 |
| CN | 106501305 | B | * | 5/2019 |
| CN | 110379781 | A | * | 10/2019 |
| CN | 209785918 | U | * | 12/2019 |
| CN | 107250778 | B | * | 9/2020 |
| EP | 1798517 | A1 | * | 6/2007 ........... G01B 21/085 |
| JP | 57-202683 | | | 12/1982 |
| JP | 60-186743 | | | 9/1985 |
| JP | S63271127 | A | * | 11/1988 |
| JP | 6 454 242 | | | 3/1989 |
| JP | H02134821 | A | * | 5/1990 |
| JP | 04248451 | A | * | 9/1992 |
| JP | H08304036 | A | * | 11/1996 |
| JP | 2856267 | A | * | 2/1999 |
| JP | 2003-139731 | | | 5/2003 |
| JP | 2004-304200 | | | 10/2004 |
| JP | 2007-292605 | A | | 11/2007 |
| JP | 2007292605 | A | * | 11/2007 |
| JP | 2008060288 | A | * | 3/2008 |
| JP | 2011-199092 | | | 10/2011 |
| JP | 2012-73055 | | | 4/2012 |
| JP | 2013-246097 | | | 12/2013 |
| JP | 2014-219222 | | | 11/2014 |
| JP | 2015086090 | A | * | 5/2015 |
| JP | 2017020828 | A | * | 1/2017 |
| JP | 2018057998 | A | * | 4/2018 |
| KR | 20060019104 | A | * | 3/2003 |
| KR | 20040108537 | A | * | 12/2004 |
| WO | WO-2006054962 | A2 | * | 5/2006 |
| WO | WO-2016035796 | A1 | * | 3/2016 |

OTHER PUBLICATIONS

17023238_May 1, 2023_JP_2017020828_A_H.pdf.*
17023238_May 4, 2023_CN_107153079_A_H.pdf.*
17023238_May 1, 2023_JP_S63271127_A_H.pdf.*
17023238_May 4, 2023_WO_2016035796_A1_H.pdf.*
17023238_May 3, 2023_CN_110379781_A_H.pdf.*
17023238_May 4, 2023_WO_2006054962_A2_H.pdf.*
17023238_May 1, 2023_KR_20040108537_A_H.pdf.*
17023238_Aug. 15, 2023_CN_107250778_B_H.pdf.*
17023238_May 1, 2023_JP_H08304036_A_H.pdf.*
17023238_May 2, 2023_CN_209785918_U_H.pdf.*
17023238_May 4, 2023_CN_101055169_A_H.pdf.*
17023238_Aug. 15, 2023_JP_2018057998_A_H.pdf.*
17023238_May 1, 2023_JP_H02134821_A_H.pdf.*

* cited by examiner

INSPECTION METHOD, INSPECTION APPARATUS, PRODUCTION METHOD, AND PRODUCTION SYSTEM FOR HEATSINK

CROSS REFERENCE TO RELATED APPLICATIONS

This application is a division of U.S. patent application Ser. No. 16/211,285 filed Dec. 6, 2018, which is based upon and claims the benefit of priority from Japanese patent application No. 2018-2907, filed on Jan. 11, 2018, the contents of each of which are incorporated herein in their entirety.

BACKGROUND

The present disclosure relates to an inspection method, an inspection apparatus, a production method, and a production system for a heatsink. For example, the present disclosure relates to an inspection method, an inspection apparatus, a production method, and a production system for a heatsink in which a heat dissipation layer is formed on a surface of a substrate which is formed by casting.

In recent years, for example, as sizes of electric circuits in semiconductor devices decrease, heat-generation densities of these electric circuits are increasing. Therefore, it is important to improve heat dissipation performance of such electric circuits and hence heatsinks are provided in such electric circuits. A substrate that constitutes such a heatsink is usually formed of a metal having a high thermal conductivity such as aluminum. However, although the thermal conductivity of the metal such as aluminum in itself is high, conductivity of heat from the metal to the air tends to be low. Therefore, a layer of carbon, a nitride, a resin, or the like that has a higher thermal conductivity to the air than the thermal conductivity from the metal to the air is formed as a heat dissipation layer on a surface of the substrate.

Incidentally, Japanese Unexamined Patent Application Publication No. S57-202683 discloses a method for manufacturing a heat dissipation base for an electro-thermal apparatus, in which a resin layer is formed on a surface of a substrate in a state where residual heat that is generated when the substrate is formed by casting remains.

Further, Japanese Unexamined Patent Application Publication No. 2003-139731 discloses a structure inspection/diagnosis system in which after a surface of a concrete structure is heated by heating means, the surface of the concrete structure is shot (i.e., photographed) by a thermography apparatus and the concrete structure is inspected for presence of cracking and the like based on acquired image data.

SUMMARY

The applicant of the present application has found the following problem. In the case where a heat dissipation layer is formed on a surface of a substrate of a heatsink, the following problem could occur. That is, the heat dissipation layer could be peeled off from the surface of the substrate due to a release agent adhering to the surface of the substrate and/or a temperature of the substrate at the time when the heat dissipation layer is formed. Therefore, for example, although it is possible to inspect the degree of peeling of the heat dissipation layer from the surface of the substrate by using the structure inspection/diagnosis system disclosed in Japanese Unexamined Patent Application Publication No. 2003-139731, it is necessary to inspect the degree of peeling of the heat dissipation layer from the surface of the substrate by using the thermography apparatus after heating the heat dissipation layer by using the heating means. Consequently, it takes time to reheat the heat dissipation layer. As a result, there is a problem that it takes time to inspect whether the heatsink is defective or not, thus making the inspection inefficient.

The present disclosure has been made in view of the above-described problem and an object thereof is to provide an inspection method, an inspection apparatus, a production method, and a production system for a heatsink, capable of improving efficiency of a process for inspecting whether a heatsink is defective or not based on a degree of peeling of a heat dissipation layer from a surface of a substrate.

A first exemplary aspect is a method for inspecting a heatsink in which a heat dissipation layer is formed on a surface of a substrate formed by casting, including shooting the heat dissipation layer by image pickup means in a state where residual heat transferred from the substrate to the heat dissipation layer remains and thereby acquiring image data representing a temperature distribution on a surface of the heat dissipation layer, the heat dissipation layer being formed by performing a film-forming process on the surface of the substrate where residual heat that is generated when the substrate is cast remains, the image pickup means being configured to receive an emission of light (an emission spectrum) from molecules of the heat dissipation layer.

In this way, it is possible, when the image data representing the temperature distribution on the surface of the heat dissipation layer is acquired, to eliminate the need for the process for heating the heat dissipation layer by using heating means such as a xenon lamp. Therefore, it is possible to improve efficiency of the process for inspecting whether the heatsink is defective or not based on the degree of peeling of the heat dissipation layer from the surface of the substrate.

The above-described method for inspecting a heatsink preferably further includes:

comparing the image data with sampling image data and calculating a difference between temperatures of a plurality of areas within a section having a predetermined size in the image data and temperatures of areas in the sampling image data corresponding to respective areas in the image data, the sampling image data being acquired in advance and representing a temperature distribution on the surface of the heat dissipation layer in a state where the heat dissipation layer is not peeled off from the surface of the substrate; and determining whether or not a total size of areas having a predetermined temperature difference or larger in the section is equal to or larger than a predetermined ratio with respect to the size of the section based on the calculated difference, and determining that the heatsink is a defective product in which the heat dissipation layer is peeled off from the surface of the substrate when the total size of the areas having the predetermined temperature difference or larger is equal to or higher than the predetermined ratio with respect to the size of the section.

In this way, it is possible to easily inspect whether the heatsink is defective or not based on the acquired image data.

The above-described method for inspecting a heatsink preferably further includes determining whether or not a total size of areas having a predetermined temperature or lower in the section having the predetermined size in the image data is equal to or larger than a predetermined ratio with respect to the size of the section, and determining that the heatsink is a defective product in which the heat dissipation layer is peeled off from the surface of the substrate when the total size of the areas having the predetermined temperature or lower is equal to or higher than the predetermined ratio with respect to the size of the section.

In this way, it is possible to easily inspect whether the heatsink is defective or not based on the acquired image data.

The above-described method for inspecting a heatsink preferably further includes displaying the image data and the sampling image data, which is acquired in advance and representing the temperature distribution on the surface of the heat dissipation layer in the state where the heat dissipation layer is not peeled off from the surface of the substrate.

It is possible to visually recognize a defective part by displaying the image data and the sampling image data as described above.

Another exemplary aspect is a method for producing a heatsink in which a heat dissipation layer is formed on a surface of a substrate formed by casting by performing a film-forming process, the method including:
detecting a temperature of residual heat of the substrate after the substrate is cast;
forming the heat dissipation layer by applying a film-forming resin to the surface of the substrate when the detected temperature of the residual heat of the substrate is equal to or higher than a film-forming temperature of the film-forming resin; and
shooting the heat dissipation layer by image pickup means in a state where residual heat transferred from the substrate to the heat dissipation layer remains and thereby acquiring image data representing a temperature distribution on a surface of the heat dissipation layer, the image pickup means being configured to receive an emission of light from molecules of the heat dissipation layer.

In this way, it is possible, when the image data representing the temperature distribution on the surface of the heat dissipation layer is acquired, to eliminate the need for the process for heating the heat dissipation layer by using heating means such as a xenon lamp. Therefore, it is possible to improve efficiency of the process for inspecting whether the heatsink is defective or not based on the degree of peeling of the heat dissipation layer from the surface of the substrate.

Another exemplary aspect is an inspection apparatus for a heatsink in which a heat dissipation layer is formed on a surface of a substrate formed by casting, the inspection apparatus including:
image pickup means for shooting the heat dissipation layer in a state where residual heat transferred from the substrate to the heat dissipation layer remains and thereby acquiring image data representing a temperature distribution on a surface of the heat dissipation layer, the heat dissipation layer being formed by performing a film-forming process on the surface of the substrate where residual heat that is generated when the substrate is cast remains, the image pickup means being configured to receive an emission of light from molecules of the heat dissipation layer; and
processing means for determining whether or not the heatsink is a defective product in which the heat dissipation layer is peeled off from the surface of the substrate based on the image data.

By the above-described configuration, it is possible, when the image data representing the temperature distribution on the surface of the heat dissipation layer is acquired, to eliminate the need for the process for heating the heat dissipation layer by using heating means such as a xenon lamp. Therefore, it is possible to improve efficiency of the process for inspecting whether the heatsink is defective or not based on the degree of peeling of the heat dissipation layer from the surface of the substrate.

In the above-described inspection apparatus for a heatsink, the processing means is preferably further configured to: compare the image data with sampling image data and calculate a difference between temperatures of a plurality of areas within a section having a predetermined size in the image data and temperatures of areas in the sampling image data corresponding to respective areas in the image data, the sampling image data being acquired in advance and representing a temperature distribution on the surface of the heat dissipation layer in a state where the heat dissipation layer is not peeled off from the surface of the substrate; and determine whether or not a size of areas having a predetermined temperature difference or larger in the section is equal to or larger than a predetermined ratio with respect to the size of the section based on the calculated difference, and determine that the heatsink is a defective product in which the heat dissipation layer is peeled off from the surface of the substrate when the size of the areas having the predetermined temperature difference or larger is equal to or higher than the predetermined ratio with respect to the size of the section.

Since it is determined whether the heatsink is defective or not by the processing means as described above, the heatsink can be easily inspected.

In the above-described inspection apparatus for a heatsink, the processing means preferably further configured to determine whether or not a size of areas having a predetermined temperature or lower in the section having the predetermined size in the image data is equal to or larger than a predetermined ratio with respect to the size of the section, and determine that the heatsink is a defective product in which the heat dissipation layer is peeled off from the surface of the substrate when the size of the areas having the predetermined temperature or lower is equal to or higher than the predetermined ratio with respect to the size of the section.

Since it is determined whether the heatsink is defective or not by the processing means as described above, the heatsink can be easily inspected.

Another exemplary aspect is a production system for a heatsink in which a heat dissipation layer is formed on a surface of a substrate formed by casting by performing a film-forming process, the production system for a heatsink including:
temperature detecting means for detecting a temperature of the substrate where residual heat that is generated when the substrate is cast remains;
forming means for forming the heat dissipation layer by applying a film-forming resin to the surface of the substrate when the detected temperature of the residual heat of the substrate is equal to or higher than a film-forming temperature of the film-forming resin;
image pickup means for shooting the heat dissipation layer in a state where residual heat transferred from the substrate to the heat dissipation layer remains and thereby acquiring image data representing a temperature distribution on a surface of the heat dissipation layer, the image pickup means being configured to receive an emission of light from molecules of the heat dissipation layer; and processing means for determining whether or not the heatsink is a defective product in which the heat dissipation layer is peeled off from the surface of the substrate based on the image data.

By the above-described configuration, it is possible, when the image data representing the temperature distribution on the surface of the heat dissipation layer is acquired, to eliminate the need for the process for heating the heat dissipation layer by using heating means such as a xenon lamp. Therefore, it is possible to improve efficiency of the process for inspecting whether the heatsink is defective or not based on the degree of peeling of the heat dissipation layer from the surface of the substrate.

According to the present disclosure, it is possible to improve efficiency of a process for inspecting whether a heatsink is defective or not based on a degree of peeling of a heat dissipation layer from a surface of a substrate.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Specific embodiments to which the present disclosure is applied are described hereinafter in detail with reference to the drawings. However, the present disclosure is not limited to the below-shown embodiments. Further, the following description and drawings are simplified as appropriate for clarifying the explanation.

First Embodiment

Figure 1:
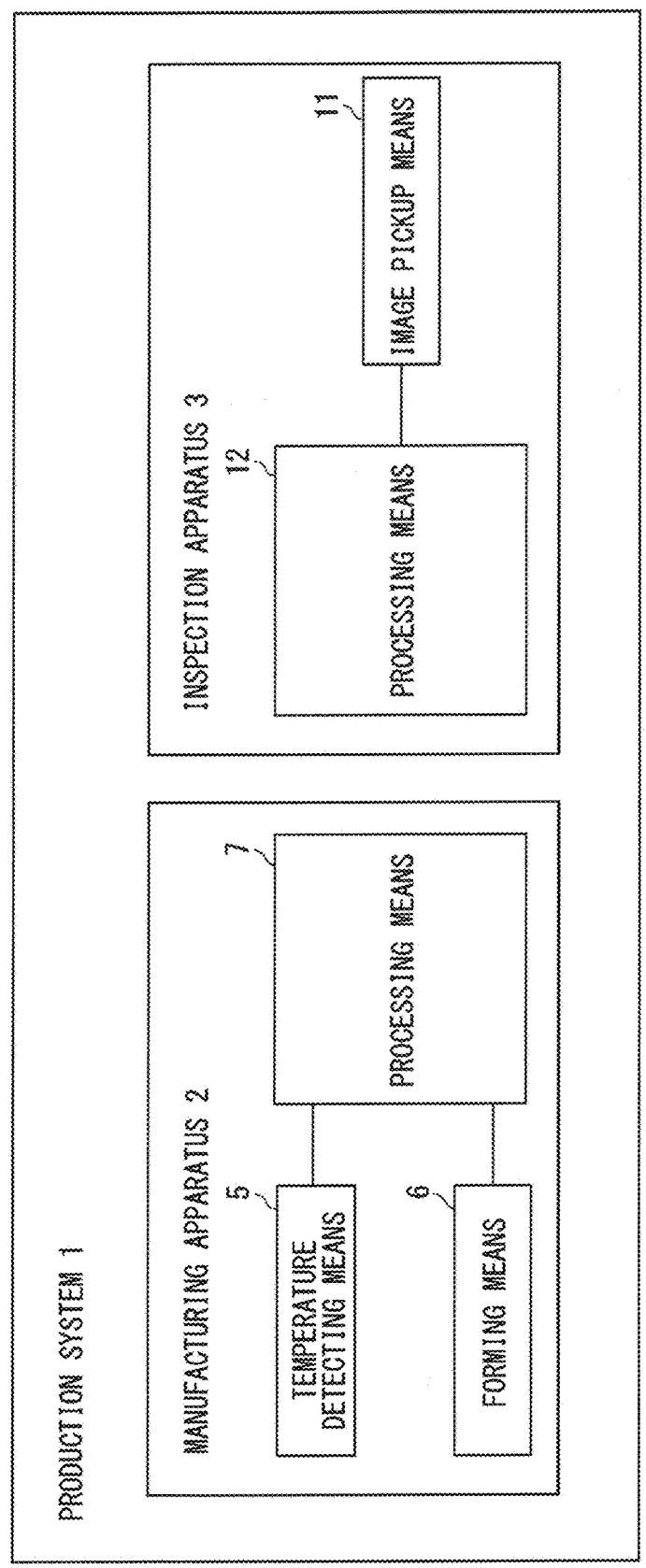
FIG. 1 is a block diagram showing a control system of a heatsink production system according to a first embodiment.
Figure 2:
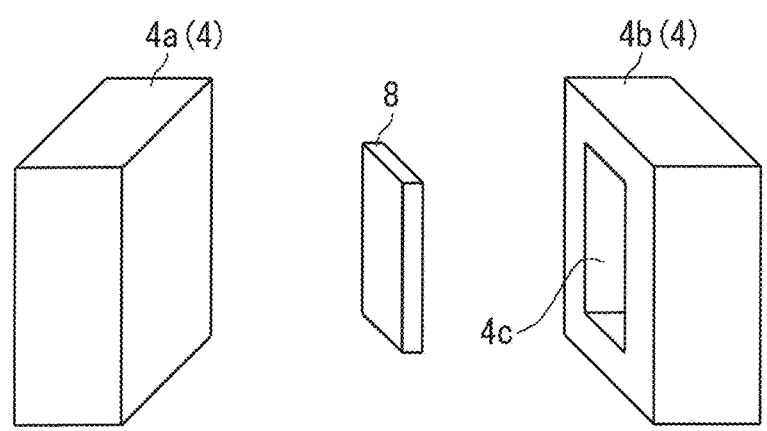
FIG. 2 shows a state in which a substrate is molded by using a mold in a heatsink manufacturing apparatus according to the first embodiment.
Figure 3:
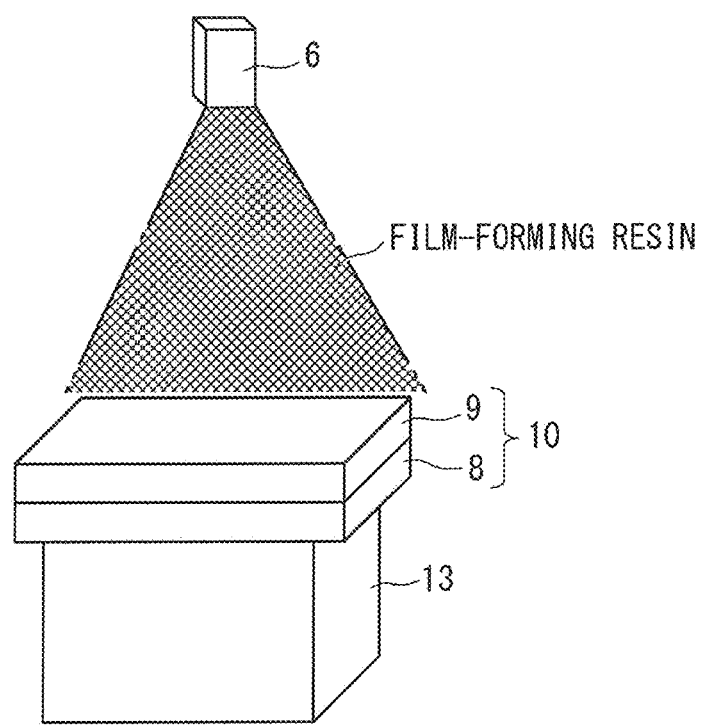
FIG. 3 shows a state in which a heat dissipation layer is formed on a surface of the substrate by using forming means in the heatsink manufacturing apparatus according to the first embodiment.

Firstly, a configuration of a heatsink production system according to an embodiment is described. FIG. 1 is a block diagram showing a control system of the heatsink production system according to this embodiment. FIG. 2 shows a state in which a substrate is molded by using a mold in a heatsink manufacturing apparatus according to this embodiment. FIG. 3 shows a state in which a heat dissipation layer is formed on a surface of the substrate by using forming means in the heatsink manufacturing apparatus according to this embodiment.

As shown in FIG. 1, the heatsink production system according to this embodiment 1 (hereinafter, also simply referred to as the production system 1) includes a heatsink manufacturing apparatus 2 and a heatsink inspection apparatus 3.

As shown in FIGS. 1 to 3, the heatsink manufacturing apparatus 2 (hereinafter, also simply referred to as the manufacturing apparatus 2) includes a mold 4, temperature detecting means 5, forming means 6, and processing means 7. Further, the manufacturing apparatus 2 is used to manufacture a heatsink 10 in which a heat dissipation layer 9 is formed on a surface of a substrate 8 which is formed by casting. Note that the heatsink 10 is not limited to heatsinks provided in electric circuits, and may instead be any type of heatsink that is provided in a place where heat needs to be dissipated.

The mold 4 is used to mold the substrate 8 by casting molten metal such as aluminum. As shown in FIG. 2, for example, the mold 4 includes a fixed die 4a and a movable die 4b. Further, the movable die 4b can be moved toward and away from the fixed die 4a. Alternatively, both dies of the mold 4 may be movable.

The mold 4 is closed by moving the movable die 4b toward the fixed die 4a, so that a cavity 4c is formed inside the fixed die 4a and the movable die 4b. The cavity 4c has a shape corresponding to the shape of the substrate 8 to be molded. Further, molten metal is poured into the cavity 4c from a molten-metal inlet (not shown). Further, the mold 4 is opened by moving the movable die 4b away from the fixed die 4a, so that the substrate 8 molded in the cavity 4c is removed from the mold 4.

The temperature detecting means 5 detects a temperature of the cast substrate 8 (i.e., the molded substrate 8). The temperature detecting means 5 is, for example, a probe-type thermometer, and detects the temperature of the surface of the substrate 8 by bringing its probe into contact with the substrate 8. The temperature detection means 5 outputs the detected temperature data to the processing means 7. However, the temperature detecting means 5 is not limited to the probe-type thermometer, and may instead be any type of thermometer capable of detecting the temperature of the surface of the substrate 8.

As shown in FIG. 3, the forming means 6 forms a heat dissipation layer 9 by applying a film-forming resin to the surface of the substrate 8. The forming means 6 is, for example, a spray nozzle that sprays a film-forming resin that can form a film (can be sintered) by residual heat that is generated when the substrate 8 is cast. As the film-forming resin, a thermoplastic resin such as polyamide imide (PAI) or a thermosetting resin such as epoxy-based paint or phenol-based paint can be used.

In this embodiment, the heat dissipation layer 9 is formed by spraying the film-forming resin on the substrate 8. However, the heat dissipation layer 9 may instead be formed by spraying fibrous material, such as carbon, mixed with a film-forming resin, on the substrate 8, or may be formed by spraying fibrous material, separately from the film-forming resin, on the substrate 8.

The processing means 7 controls the forming means 6 based on temperature data of the substrate 8 received from the temperature detecting means 5, details of which will be described later.

The inspection apparatus 3 for the heatsink 10 (hereinafter, also simply referred to as the inspection apparatus 3) determines whether the heatsink 10 is a conforming product (e.g., a satisfactory product) or a defective product based on the degree of peeling of the heat dissipation layer 9 from the surface of the substrate 8.

Figure 4:
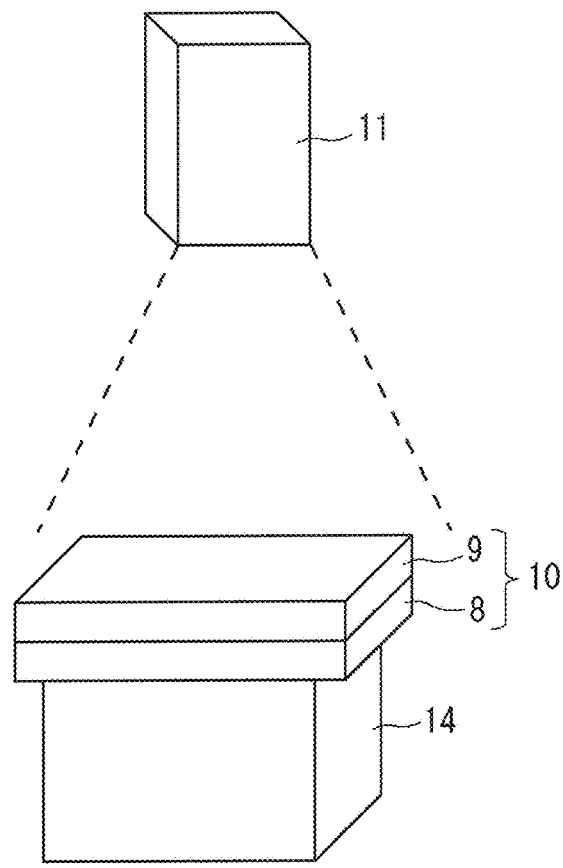
FIG. 4 shows a state in which image data is acquired by using image pickup means in a heatsink inspection apparatus according to the first embodiment.

As shown in FIG. 1, the inspection apparatus 3 includes image pickup means 11 and processing means 12. FIG. 4 shows a state in which image data is acquired by using the image pickup means in the heatsink inspection apparatus according to this embodiment. As shown in FIG. 4, the image pickup means 11 shoots (i.e., photographs) the heat dissipation layer 9 formed on the substrate 8 and thereby acquires image data representing a temperature distribution on the surface of the heat dissipation layer 9.

The image pickup means 11 includes a light-receiving element that receives an emission of light from molecules of the heat dissipation layer 9. For example, the image pickup means 11 is an infrared thermo-camera. The image pickup means 11 outputs the acquired image data to the processing means 12. However, although the infrared thermo-camera is used as an example of the image pickup means 11, any type of image pickup means capable of receiving an emission of light from molecules of the heat dissipation layer 9 and thereby acquiring image data may be used.

The processing means 12 determines whether the heatsink 10 is a conforming product or a defective product based on the image data received from the image pickup means 11, details of which will be described later.

Figure 5:
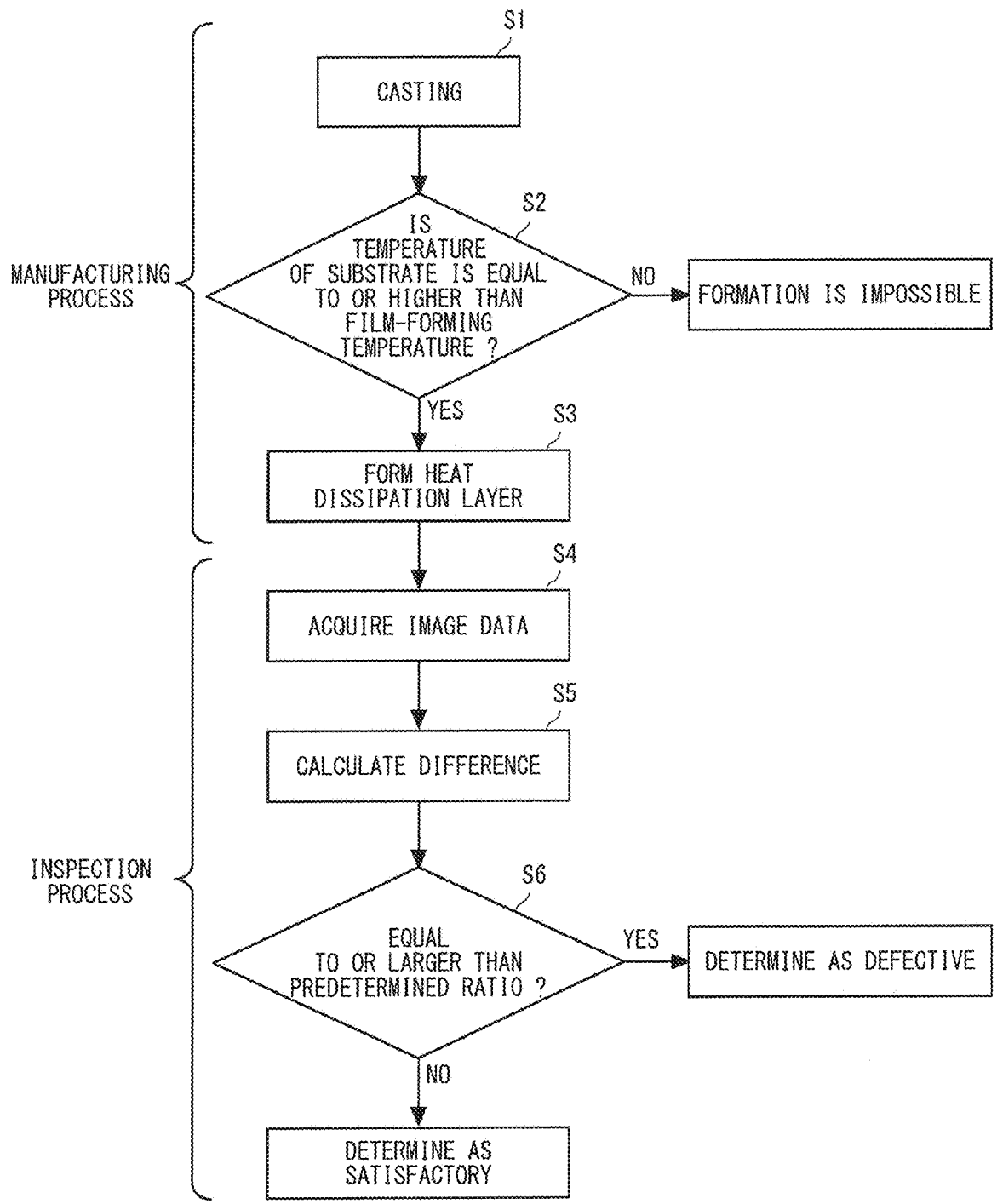
FIG. 5 is a flowchart showing a flow of a heatsink manufacturing method according to the first embodiment.

Next, a method for producing a heatsink 10 according to this embodiment is described. FIG. 5 is a flowchart showing a flow of a method for producing a heatsink according to this embodiment. As shown in FIG. 5, the method for producing a heatsink 10 according to this embodiment includes a process for manufacturing the heatsink 10 and a process for inspection thereof.

Firstly, a substrate 8 is formed by casting (S1). Specifically, the mold 4 is closed by moving the movable die 4b toward the fixed die 4a and molten metal is poured into the cavity 4c through a molten-metal inlet. Then, after solidifying the molten metal, the mold 4 is opened by moving the movable die 4b away from the fixed die 4a and the substrate 8 is removed from the mold 4 as shown in FIG. 2. After that, in a state where residual heat generated in the casting remains, the substrate 8 is placed on a placement table 13 by using, for example, conveying means (not shown).

Next, the processing unit 7 of the production apparatus 2 determines whether or not a temperature of a surface of the substrate 8 is equal to or higher than a temperature at which a film-forming resin applied to the substrate 8 can form a film (can be sintered) (i.e., a predetermined film-forming temperature) (S2). Specifically, the temperature detecting means 5 detects the temperature of the surface of the substrate 8 placed on the placement table 13, which is in a state where residual heat generated in the casting still remains, and outputs the detected temperature data to the processing means 7.

Note that, for example, the temperature detecting means 5 is preferably disposed on the placement table 13 so that when the substrate 8 is placed on the placement table 13, the probe of the temperature detecting means 5 comes into contact with the substrate 8 and thereby detects its surface temperature. In this way, when the substrate 8 is placed on the placement table 13, the temperature of the surface of the substrate 8 can be automatically detected. Then, the processing means 7 determines whether or not the temperature of the surface of the substrate 8 in the state where the residual heat remains is equal to or higher than the film-forming temperature based on the temperature data received from the temperature detection means 5.

When the temperature of the surface of the substrate 8 is equal to or higher than the film-forming temperature (Yes at S2), the processing means 7 of the manufacturing apparatus 2 forms a heat dissipation layer 9 by controlling the forming means 6 and thereby applying a film-forming resin to the surface of the substrate 8 (S3). Note that since the temperature of the surface of the substrate 8 is equal to or higher than the film-forming temperature, the film-forming resin forms a film on the surface of the substrate 8 and thereby becomes the heat dissipation layer 9. In this way, the heatsink 10 having the heat dissipation layer 9 formed on the surface of the substrate 8 is manufactured. The manufactured heatsink 10 is placed on a placement table 14 by using, for example, conveying means (not shown) in a state where residual heat from the substrate 8 remains in the heat dissipation layer 9.

Note that the film-forming resin is preferably applied in a period during which the temperature of the surface of the substrate 8 is equal to or higher than the film-forming temperature and is lower than a set temperature that is higher than the film-forming temperature by a predetermined temperature (e.g., a temperature that is 100° C. higher than the film-forming temperature).

On the other hand, when the temperature of the surface of the substrate 8 is lower than the film-forming temperature, the processing means 7 of the manufacturing apparatus 2 determines that the heat dissipation layer 9 cannot be formed (No at S2).

Next, the processing unit 12 of the inspection apparatus 3 acquires image data, which is obtained by shooting the heat dissipation layer 9 in the image pickup means 11 and represents a temperature distribution on the surface of the heat dissipation layer 9 (S4). Specifically, when the heatsink 10 is placed on the placement table 14, the processing means 12 controls the image pickup means 11 so that the image pickup means 11 shoots (i.e., photographs) the heatsink 10 placed on the placement table 14 in the state where the residual heat of the substrate 8 still remains in the heat dissipation layer 9.

In general, unless the heat dissipation layer 9 is heated by using a xenon lamp or the like, satisfactory image data cannot be acquired by the image pickup means 11. However, in this embodiment, since the image pickup means 11 shoots the heatsink 10 in which the residual heat of the substrate 8 still remains in the heat dissipation layer 9, satisfactory image data can be acquired by the image pickup means 11.

The image pickup means 11 outputs the acquired image data representing the temperature distribution on the surface of the heat dissipation layer 9 to the processing unit 12. It should be noted that in order to acquire satisfactory image data by the image pickup means 11, the temperature of the surface of the heat dissipation layer 9 at the time when the heat dissipation layer 9 is shot (i.e., photographed) by the image pickup means 11 is preferably about 150° C. or higher. However, the temperature of the heat dissipation layer 9 at the time when the image data is acquired by the image pickup means 11 may be any temperature as long as satisfactory image data representing the temperature distribution on the surface of the heat dissipation layer 9 can be acquired.

Next, the processing unit 12 of the inspection apparatus 3 compares the acquired image data with sampling image data, which is acquired in advance and represents a temperature distribution on the surface of the heat dissipation layer 9 in a state where the heat dissipation layer 9 is not peeled off from the surface of the substrate 8, and calculates a difference (a temperature difference) between temperatures of a plurality of areas within a section having a predetermined size in the image data and temperatures of areas in the sampling image data corresponding to respective areas in the image data (S5).

Specifically, as sampling image data, image data representing a temperature distribution on the surface of the heat dissipation layer 9 in a state where the heat dissipation layer 9 is not peeled off from the surface of the substrate 8 is acquired in advance by performing the above-described processes in the steps S1 to S4. That is, the sampling image data is image data that is acquired by shooting a heatsink 10 that is manufactured in the same manner as the heatsink 10 to be inspected under the same condition as that for the heatsink 10 to be inspected (for example, the same elapsed time after the formation of the heat dissipation layer 9, etc.) by using the image pickup means 11.

Figure 6:
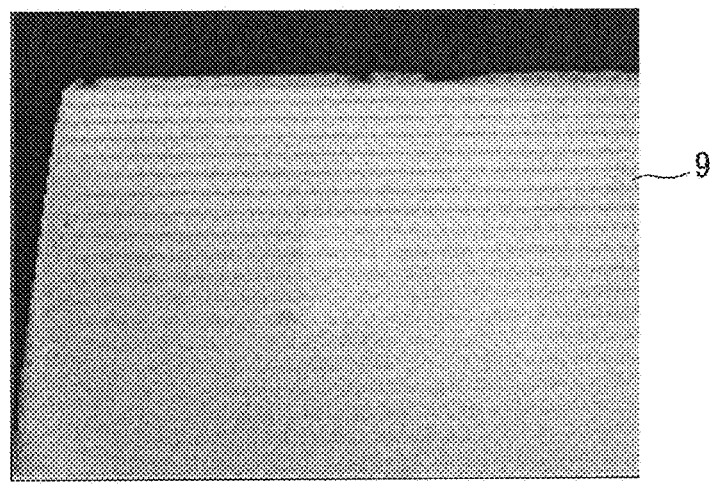
FIG. 6 is sampling image data representing a part of a temperature distribution on the surface of the heat dissipation layer in a state where the heat dissipation layer is not peeled off from the surface of the substrate in the heatsink.
Figure 7:
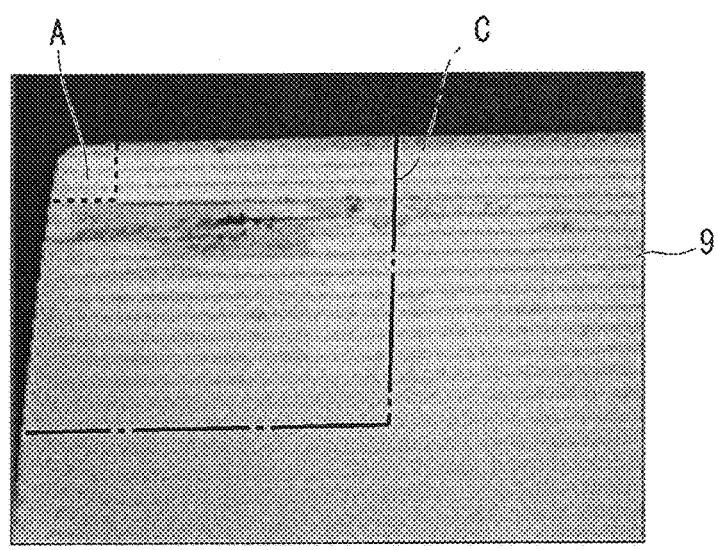
FIG. 7 is image data representing a part of a temperature distribution on the surface of the heat dissipation layer in a state where a part of the heat dissipation layer is peeled off from the surface of the substrate in the heatsink.

Note that FIG. 6 shows a sampling image data representing a part of a temperature distribution on a surface of a heat dissipating layer in a state where the heat dissipation layer is not peeled off from a surface of a substrate in a heatsink. FIG. 7 shows an image data representing a part of a temperature distribution on a surface of a heat dissipating layer in a state where a part of the heat dissipation layer is peeled off from a surface of a substrate in a heatsink. Note that in FIGS. 6 and 7, the lighter the color of an area is, the higher the temperature of the area is.

As shown in FIGS. 6 and 7, it is possible to estimate a temperature distribution on the surface of the heat dissipation layer 9 by using color-coding. Then, as shown in FIG. 6, when the heat dissipation layer 9 is not peeled off from the surface of the substrate 8, the temperature distribution on the surface of the heat dissipation layer 9 is roughly uniform. On the other hand, as shown in FIG. 7, when a part of the heat dissipation layer 9 is peeled off from the surface of the substrate 8, the temperature of the area where the heat dissipation layer 9 is peeled off is lower than the temperature of the area where the heat dissipation layer 9 is not peeled off.

Therefore, the processing means 12 of the inspection apparatus 3 calculates a difference between temperatures of a plurality of areas within a section having a predetermined size in the image data and temperatures of areas in the sampling image data corresponding to respective areas in the image data. That is, the processing means 12 calculates a temperature difference between each of the plurality of areas within the section in the image data and a respective one of the areas in the sampling image data.

Note that the section is defined by dividing a part where the heat dissipation layer 9 is shown in the image data into sections having a predetermined size. Further, one or a plurality of sections are present in the image data. Further, the area is defined by dividing the section and a plurality of areas are present within the section. Note that in FIG. 7, one example section C is indicated by alternate long and short dash lines and one example area A is indicated by broken lines. Note that the section and the area may be defined on a pixel basis.

The processing unit 12 of the inspection apparatus 3 repeats the above-described process in the step S5 and thereby calculates a temperature difference for each area A in each section C in the entire area of the image data.

Next, the processing unit 12 of the inspection apparatus 3 determines, based on the temperature difference in each area A calculated for each section C, whether or not a total size of areas A having the predetermined temperature difference or larger in the section C is equal to or higher than a predetermined ratio with respect to the size of the section C (S6).

When the total size of areas A having the predetermined temperature difference or larger in the section C is equal to or higher than the predetermined ratio with respect to the size of the section C, the processing means 12 of the inspection apparatus 3 determines that the heatsink is a defective product in which the heat dissipation layer 9 is peeled off from the surface of the substrate 8 (Yes at S6). That is, when there is a section C in which the total size of areas A having the predetermined temperature difference or larger is equal to or higher than the predetermined ratio with respect to the size of the section C in the image data, the processing means 12 determines that the heatsink 10 is defective.

On the other hand, when the total size of areas A having the predetermined temperature difference or larger in the section C is smaller than the predetermined ratio with respect to the size of the section C, the processing means 12 of the inspection apparatus 3 determines that the heatsink is a conforming product (e.g., a satisfactory product) in which the heat dissipation layer 9 is not peeled off from the surface of the substrate 8 (No at S6). That is, when there is no section C in which the total size of areas A having the predetermined temperature difference or larger is equal to or higher than the predetermined ratio with respect to the size of the section C in the image data, the processing means 12 determines that the heatsink 10 is satisfactory (i.e., is a conforming product).

In the above-described inspection method, the inspection apparatus, the production method, the production system for the heatsink 10 according to this embodiment, the heatsink 10 is shot (i.e., photographed) by the image pickup means 11 in the state where the residual heat of the substrate 8 still remains in the heat dissipation layer 9 in order to acquire image data representing a temperature distribution on the surface of the heat dissipation layer 9. Therefore, satisfactory image data can be acquired.

Accordingly, in this embodiment, it is possible, when image data representing a temperature distribution on the surface of the heat dissipation layer 9 is acquired, to eliminate the need for heating process for heating the heat dissipation layer 9 by using heating means such as a xenon lamp. As a result, it is possible to improve efficiency of a process for inspecting whether the heatsink 10 is defective or not based on the degree of peeling of the heat dissipation layer 9 from the surface of the substrate 8. In addition, it is possible to eliminate the need for the heating means such as a xenon lamp and thereby to contribute to a reduction in the production cost.

In particular, in this embodiment, since it is determined whether the heatsink 10 is defective or not by the processing means 12 of the inspection apparatus 3, it is possible to easily inspect whether the heatsink 10 is defective or not.

Note that in this embodiment, after calculating the temperature difference in each area A in each section C in the entire area of the image data, it is determined whether or not the total size of areas A having the predetermined temperature difference or larger in each section C is equal to or higher than the predetermined ratio with respect to the size of the section C. However, it is also possible to repeat a process of calculating the temperature difference in each area A in each section C in a part of the image data and determining whether or not the total size of areas A having the predetermined temperature difference or larger in each section C is equal to or higher than the predetermined ratio with respect to the size of the section C. In this case, the inspection process can be terminated once the heatsink 10 is determined to be defective.

Second Embodiment

In the above-described first embodiment, it is determined whether the heatsink 10 is a conforming product or a defective product by using sampling image data. However, it may be determined whether the heatsink 10 is a conforming product or a defective product without using the sampling image data.

Figure 8:
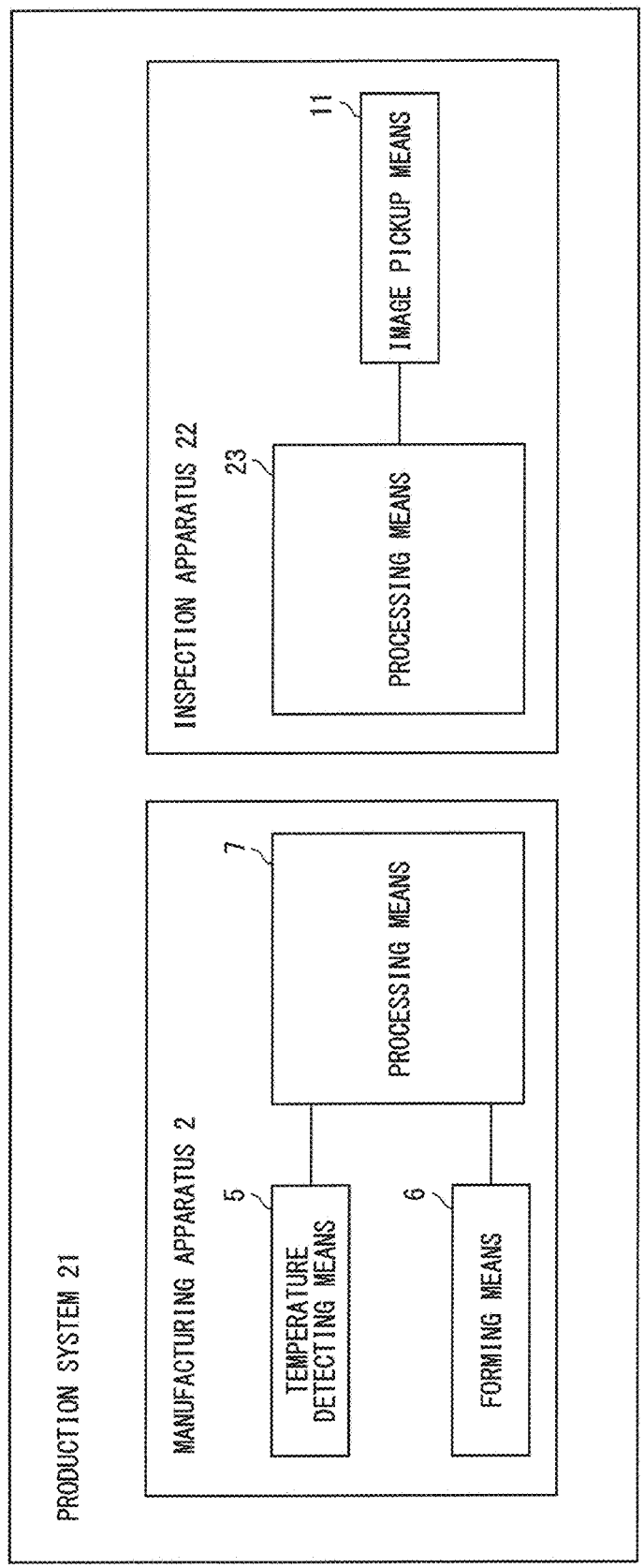
FIG. 8 is a block diagram showing a control system of a heatsink production system according to a second embodiment.

FIG. 8 is a block diagram showing a control system of a heatsink production system according to this embodiment. In the following description, descriptions of the same components and structures as those of the first embodiment are omitted. Further, the same components as those of the first embodiment are indicated by the same symbols as those of the first embodiment.

As shown in FIG. 8, a configuration of the manufacturing apparatus 2 of a production system 21 according to this embodiment is identical to that in the production system 1 according to the first embodiment. However, processes performed by the processing means 23 of the inspection apparatus 22 differ from those performed by the processing means 12 of the production system 1.

Figure 9:
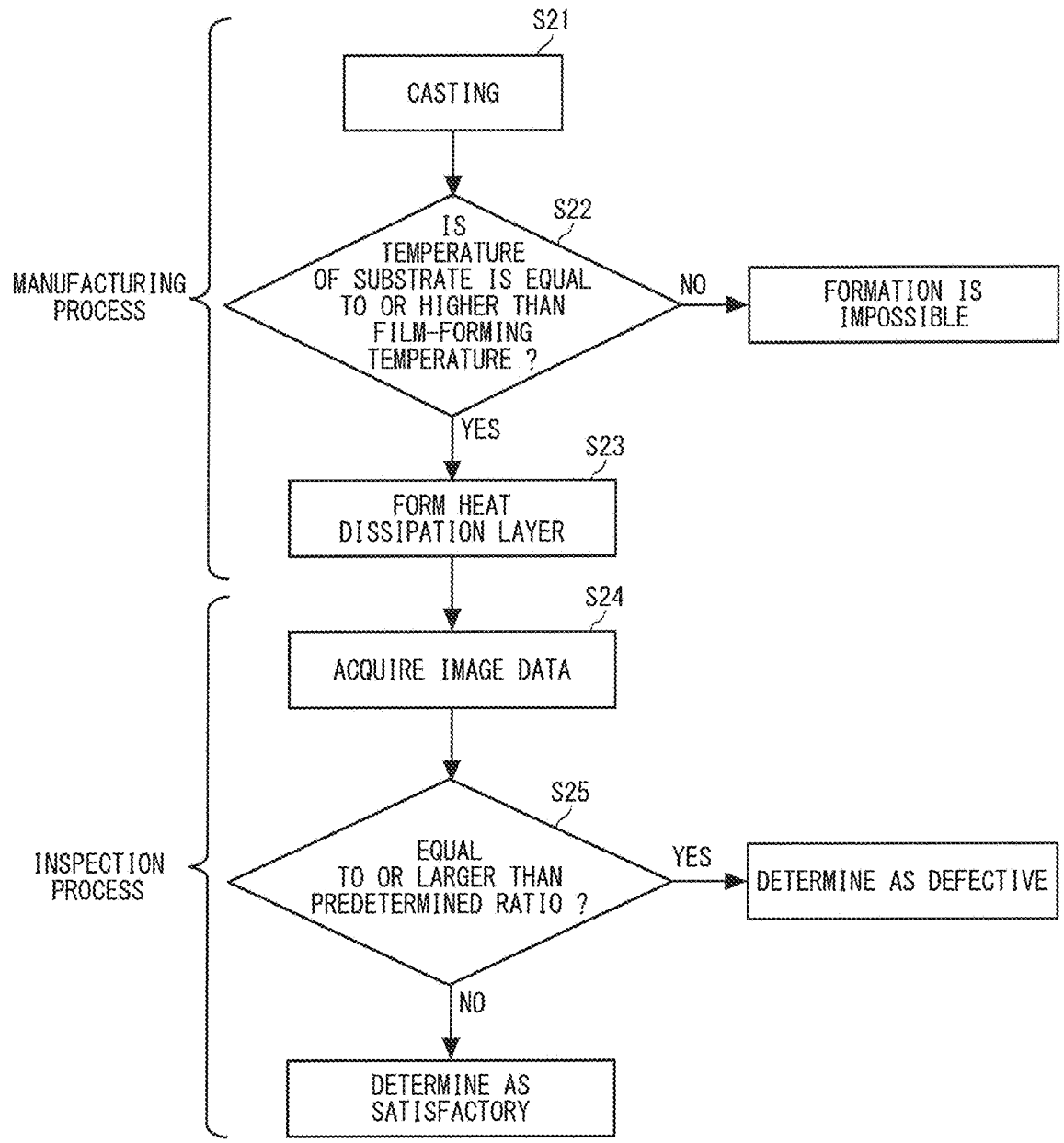
FIG. 9 is a flowchart showing a flow of a heatsink manufacturing method according to the second embodiment.

Processes performed by the processing means 23 of the inspection apparatus 22 in a method for producing a heatsink 10 are explained hereinafter in detail. FIG. 9 is a flowchart showing a flow of a method for producing a heatsink according to this embodiment.

As shown in FIG. 9, steps S21 to S24, i.e., steps up to the acquisition of image data in the heatsink production method according to this embodiment are the same as the steps S1 to S4, i.e., the steps up to the acquisition of image data in the heatsink production method according to the first embodiment.

Then, in the heatsink manufacturing method according to this embodiment, after the process in the step S24, the processing means 23 of the inspection apparatus 22 determines whether or not the total size of areas A having a predetermined temperature or lower in a section C having a predetermined size in the acquired image data is equal to or larger than a predetermined ratio with respect to the size of that section C (S25).

That is, in this embodiment, it is determined whether or not temperatures of areas A in a section C in the image data is equal to or lower than the predetermined temperature. Then, it is determined whether or not the total size of areas A, which have been determined to have the predetermined temperature or lower in the section C, is equal to or higher than the predetermined ratio with respect to the size of the section C. Note that the predetermined temperature may be set to, for example, 130° C. However, the predetermined temperature can be changed as desired according to the material of the film-forming resin or the like.

When the total size of the areas A, which have been determined to have the predetermined temperature or lower in the section C, is equal to or higher than the predetermined ratio with respect to the size of the section C, the processing means 23 of the inspection apparatus 22 determines that the heatsink 10 is defective (Yes at S25). That is, when there is a section C in which the total size of areas A, which have been determined to have the predetermined temperature or lower in the section C, is equal to or higher than the predetermined ratio with respect to the size of the section C in the image data, the processing means 23 determines that the heatsink 10 is defective.

On the other hand, when the total size of the areas A, which have been determined to have the predetermined temperature or lower in the section C, is smaller than the predetermined ratio with respect to the size of the section C, the processing means 23 of the inspection apparatus 22 determines that the heatsink 10 is satisfactory (No at S25). That is, when there is no section C in which the total size of areas A, which have been determined to have the predetermined temperature or lower in the section C, is equal to or higher than the predetermined ratio with respect to the size of the section C in the image data, the processing means 23 determines that the heatsink 10 is satisfactory.

In the above-described inspection method, the inspection apparatus, the production method, the production system for the heatsink 10 according to this embodiment, the heatsink 10 is also shot by the image pickup means 11 in the state where the residual heat of the substrate 8 still remains in the heat dissipation layer 9 in order to acquire image data representing a temperature distribution on the surface of the heat dissipation layer 9. Therefore, satisfactory image data can be acquired.

Accordingly, in this embodiment, it is possible, when image data representing a temperature distribution on the surface of the heat dissipation layer 9 is acquired, to eliminate the need for heating process for heating the heat dissipation layer 9 by using heating means such as a xenon lamp. As a result, it is possible to improve efficiency of a process for inspecting whether the heatsink 10 is defective or not based on the degree of peeling of the heat dissipation layer 9 from the surface of the substrate 8. In addition, it is possible to eliminate the need for the heating means such as a xenon lamp and thereby to contribute to a reduction in the production cost.

In particular, in this embodiment, since it is also determined whether the heatsink 10 is defective or not by the processing means 23 of the inspection apparatus 22, it is possible to easily inspect whether the heatsink 10 is defective or not.

Note that in the above-described process in the step S25, after determining the temperature in each area A in the section C in the entire area of the image data, it may be determined whether or not the total size of areas A having the predetermined temperature or lower in the section C is equal to or higher than the predetermined ratio with respect to the size of the section C. Alternatively, it is also possible to repeat a process of determining the temperature in each area A in the section C in a part of the image data and determining whether or not the total size of areas A having the predetermined temperature or lower in the section C is equal to or higher than the predetermined ratio with respect to the size of the section C. In the latter case, the inspection process can be terminated once the heatsink 10 is determined to be defective.

Third Embodiment

In the above-described first embodiment, the processing means 12 of the inspection apparatus 3 determines whether the heatsink 10 is a conforming product or a defective product. However, an operator (e.g., a worker) may determine whether the heatsink 10 is a conforming product or a defective product by using display means.

Figure 10:
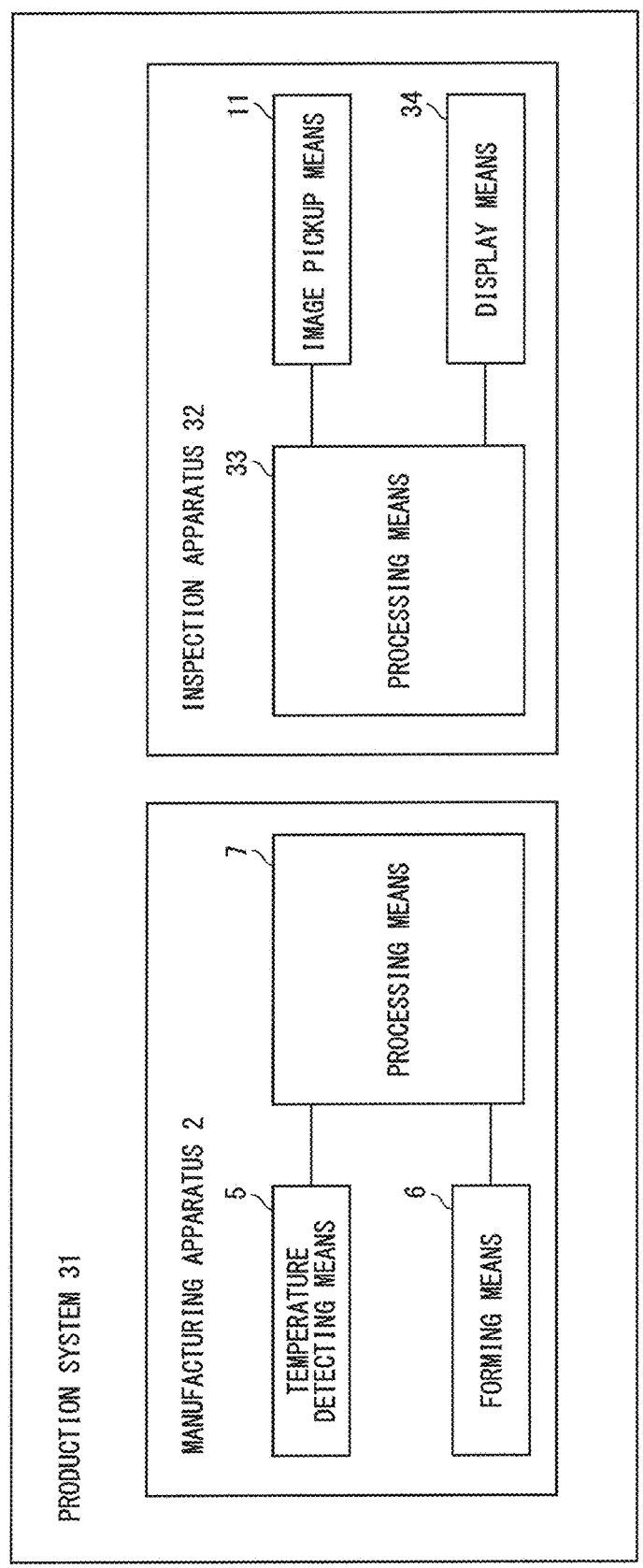
FIG. 10 is a block diagram showing a control system of a heatsink production system according to a third embodiment.

FIG. 10 is a block diagram showing a control system of a heatsink production system according to this embodiment. In the following description, descriptions of the same components and structures as those of the first embodiment are omitted. Further, the same components as those of the first embodiment are indicated by the same symbols as those of the first embodiment.

As shown in FIG. 10, a configuration of the manufacturing apparatus 2 of a production system 31 according to this embodiment is identical to that in the production system 1 according to the first embodiment. However, processes performed by the processing means 33 of the inspection device 32 differ from those performed by the processing means 12 of the production system 1. Further, the production system 31 also differs from the production system 1 because the inspection device 32 includes display means 34.

Specifically, when the processing unit 33 of the inspection apparatus 32 receives image data from the image pickup means 11, the processing unit 33 displays the image data and sampling image data in the display means 34. In this way, an operator compares the image data displayed in the display means 34 with the sampling image data also displayed in the display means 34. Then, for example, when an area where the temperature of the surface of the heat dissipation layer 9 is lower than a predetermined threshold temperature is larger than an area where the temperature of the surface of the heat dissipation layer 9 is determined to be lower than the predetermined threshold temperature due to an error in the image pickup means 11, the operator can determine that the heatsink 10 is defective.

Therefore, in this embodiment, it is possible to visually recognize a defective part by displaying image data and sampling image data.

The present disclosure is not limited to the above-described embodiments, and various modifications can be made without departing the spirit and scope of the present disclosure.

In the first and second embodiments, although the image data and the sampling image data are not displayed in display means, they may be displayed in display means.

The heatsink in the above-described embodiment may have a configuration in which, for example, a heat dissipation layer is formed in a cast article such as a cylinder head of an engine.

Although the present disclosure is described as a hardware configuration in the above-described embodiments, the present disclosure is not limited to the hardware configurations. In the present disclosure, an arbitrary process can also be implemented by causing a CPU (Central Processing Unit) to execute a computer program.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A method for inspecting a heatsink in which a heat dissipation layer is formed on a surface of a substrate formed by casting, comprising:
    shooting the heat dissipation layer by image pickup means in a state where residual heat transferred from the substrate to the heat dissipation layer remains and thereby acquiring image data representing a temperature distribution on a surface of the heat dissipation layer, the heat dissipation layer being formed by performing a film-forming process on the surface of the substrate where residual heat that is generated when the substrate is cast remains, the image pickup means being configured to receive an emission of light from molecules of the heat dissipation layer;
    comparing the image data with sampling image data and calculating a difference between temperatures of a plurality of areas within a section having a predetermined size in the image data and temperatures of areas in the sampling image data corresponding to respective areas in the image data, the sampling image data being acquired in advance and representing a temperature distribution on the surface of the heat dissipation layer in a state where the heat dissipation layer is not peeled off from the surface of the substrate; and
    determining whether or not a total size of areas having a predetermined temperature difference or larger in the section is equal to or larger than a predetermined ratio with respect to the size of the section based on the calculated difference, and determining that the heatsink is a defective product in which the heat dissipation layer is peeled off from the surface of the substrate when the total size of the areas having the predetermined temperature difference or larger is equal to or higher than the predetermined ratio with respect to the size of the section.

2. The method for inspecting a heatsink according to claim 1, further comprising displaying the image data and the sampling image data, which is acquired in advance and representing the temperature distribution on the surface of the heat dissipation layer in the state where the heat dissipation layer is not peeled off from the surface of the substrate.

3. A method for producing a heatsink in which a heat dissipation layer is formed on a surface of a substrate formed by casting by performing a film-forming process, the method comprising:

detecting a temperature of residual heat of the substrate after the substrate is cast;

forming the heat dissipation layer by applying a film-forming resin to the surface of the substrate when the detected temperature of the residual heat of the substrate is equal to or higher than a film-forming temperature of the film-forming resin;

shooting the heat dissipation layer by image pickup means in a state where residual heat transferred from the substrate to the heat dissipation layer remains and thereby acquiring image data representing a temperature distribution on a surface of the heat dissipation layer, the image pickup means being configured to receive an emission of light from molecules of the heat dissipation layer;

comparing the image data with sampling image data and calculating a difference between temperatures of a plurality of areas within a section having a predetermined size in the image data and temperatures of areas in the sampling image data corresponding to respective areas in the image data, the sampling image data being acquired in advance and representing a temperature distribution on the surface of the heat dissipation layer in a state where the heat dissipation layer is not peeled off from the surface of the substrate; and determining whether or not a total size of areas having a predetermined temperature difference or larger in the section is equal to or larger than a predetermined ratio with respect to the size of the section based on the calculated difference, and determining that the heatsink is a defective product in which the heat dissipation layer is peeled off from the surface of the substrate when the total size of the areas having the predetermined temperature difference or larger is equal to or higher than the predetermined ratio with respect to the size of the section.

4. A method for inspecting a heatsink in which a heat dissipation layer is formed on a surface of a substrate formed by casting, comprising:

shooting the heat dissipation layer by image pickup means in a state where residual heat transferred from the substrate to the heat dissipation layer remains and thereby acquiring image data representing a temperature distribution on a surface of the heat dissipation layer, the heat dissipation layer being formed by performing a film-forming process on the surface of the substrate where residual heat that is generated when the substrate is cast remains, the image pickup means being configured to receive an emission of light from molecules of the heat dissipation layer; and determining whether or not a total size of areas having a predetermined temperature or lower in the section having the predetermined size in the image data is equal to or larger than a predetermined ratio with respect to the size of the section, and determining that the heatsink is a defective product in which the heat dissipation layer is peeled off from the surface of the substrate when the total size of the areas having the predeteiniined temperature or lower is equal to or higher than the predetermined ratio with respect to the size of the section.

* * * * *